US009255682B2

(12) United States Patent
Lai

(10) Patent No.: US 9,255,682 B2
(45) Date of Patent: Feb. 9, 2016

(54) LASER LAMP SYSTEM FOR A VEHICLE

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 290 days.

(21) Appl. No.: 13/926,388

(22) Filed: Jun. 25, 2013

(65) Prior Publication Data

US 2014/0301098 A1 Oct. 9, 2014

(30) Foreign Application Priority Data

Apr. 3, 2013 (TW) ............................ 102112212 A

(51) Int. Cl.
*H01L 33/50* (2010.01)
*F21S 8/10* (2006.01)

(52) U.S. Cl.
CPC ......... *F21S 48/1225* (2013.01); *F21S 48/1145* (2013.01); *F21S 48/13* (2013.01)

(58) Field of Classification Search
CPC ........... F21K 9/56; F21V 13/12; F21V 13/14; B60Q 1/04; H01J 1/62; H01J 1/70; G02B 5/0226
See application file for complete search history.

(56) References Cited

U.S. PATENT DOCUMENTS

| | | | | | |
|---|---|---|---|---|---|
| 3,491,237 | A * | 1/1970 | Tillett | ........................ | 250/458.1 |
| 5,208,462 | A * | 5/1993 | O'Connor et al. | ......... | 250/493.1 |
| 5,706,134 | A * | 1/1998 | Konno et al. | ................. | 359/599 |
| 6,068,383 | A * | 5/2000 | Robertson et al. | .............. | 362/84 |
| 6,469,322 | B1 * | 10/2002 | Srivastava et al. | .............. | 257/89 |
| 6,602,596 | B2 * | 8/2003 | Kimura et al. | ................ | 428/327 |
| 6,653,765 | B1 * | 11/2003 | Levinson et al. | ............. | 313/112 |
| 6,709,143 | B2 * | 3/2004 | Harada et al. | ................. | 362/558 |
| 7,906,892 | B2 * | 3/2011 | Choi et al. | ..................... | 313/112 |
| 8,480,257 | B2 * | 7/2013 | Shang et al. | .................. | 362/255 |
| 8,637,883 | B2 * | 1/2014 | Chakraborty | ................... | 257/98 |
| 8,764,225 | B2 * | 7/2014 | Narendran et al. | ........... | 362/231 |
| 2007/0096113 | A1 * | 5/2007 | Inoshita et al. | ................. | 257/79 |

* cited by examiner

*Primary Examiner* — Ismael Negron
(74) *Attorney, Agent, or Firm* — Novak Druce Connolly Bove + Quigg LLP

(57) ABSTRACT

A lamp system includes a laser source and a reflecting plate for reflecting light generated from the laser source. The laser source includes a laser diode, a light splitter for splitting light generated from the laser diode into a plurality of beams, a phosphor layer for changing color of the beams transmitted from the light splitter, and a diffusing layer for diffusing the beams transmitted from the light splitter, to thereby form a surface light source. The lamp system is configured to be used in a vehicle.

16 Claims, 3 Drawing Sheets

LASER LAMP SYSTEM FOR A VEHICLE

BACKGROUND

1. Technical Field

The disclosure relates to an illumination system, and particularly to a vehicle lamp system with a high light utilizing efficiency.

2. Description of Related Art

A conventional vehicle lamp apparatus used in a vehicle provides illumination to by a halogen bulb cooperating with a parabolic reflecting mirror. However, the vehicle lamp apparatus using the halogen bulb as the light source has many shortcomings, such as poor light distributions, low light utilizing efficiency, etc.

What is needed, therefore, is a vehicle lamp system which can overcome the limitations described above.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
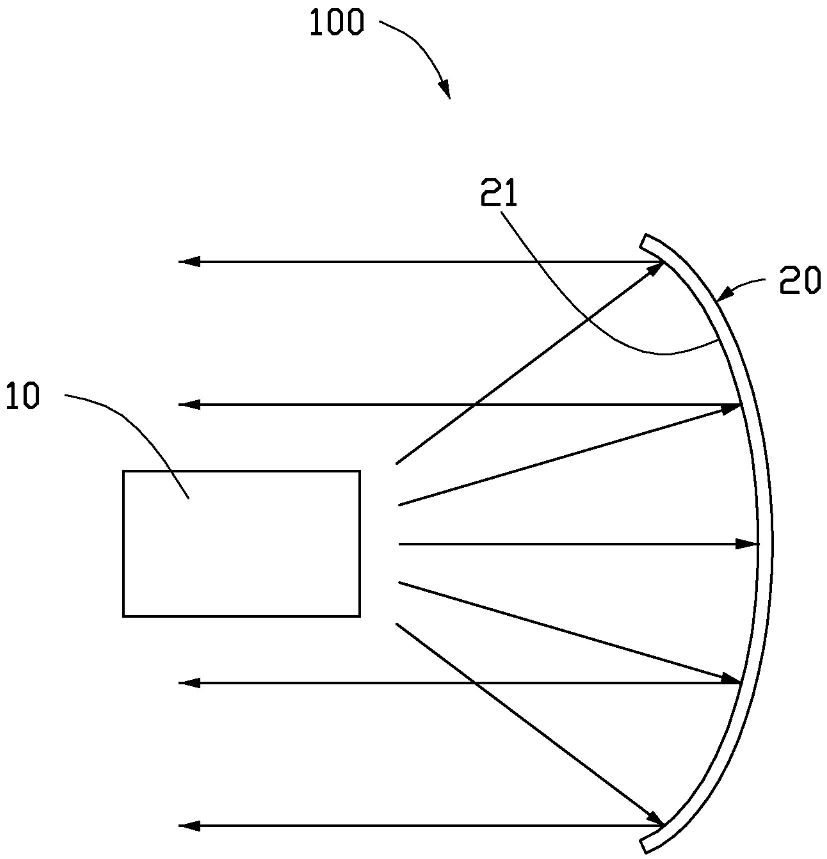
FIG. 1 is a schematic view of a vehicle lamp system in accordance with a first embodiment of the disclosure.

Referring to FIG. 1, a vehicle lamp system 100 in accordance with a first embodiment of the disclosure is shown. The vehicle lamp system 100 is disposed in a front portion of a vehicle for illuminating a road in front of the vehicle. The vehicle lamp system 100 includes a laser source 10 and a reflecting plate 20 for reflecting light generated from the laser source 10 out of the vehicle. The reflecting plate 20 is arc-shaped and has a concave reflecting face 21. The reflecting face 21 faces light emitting direction of the laser source 10.

Figure 2:
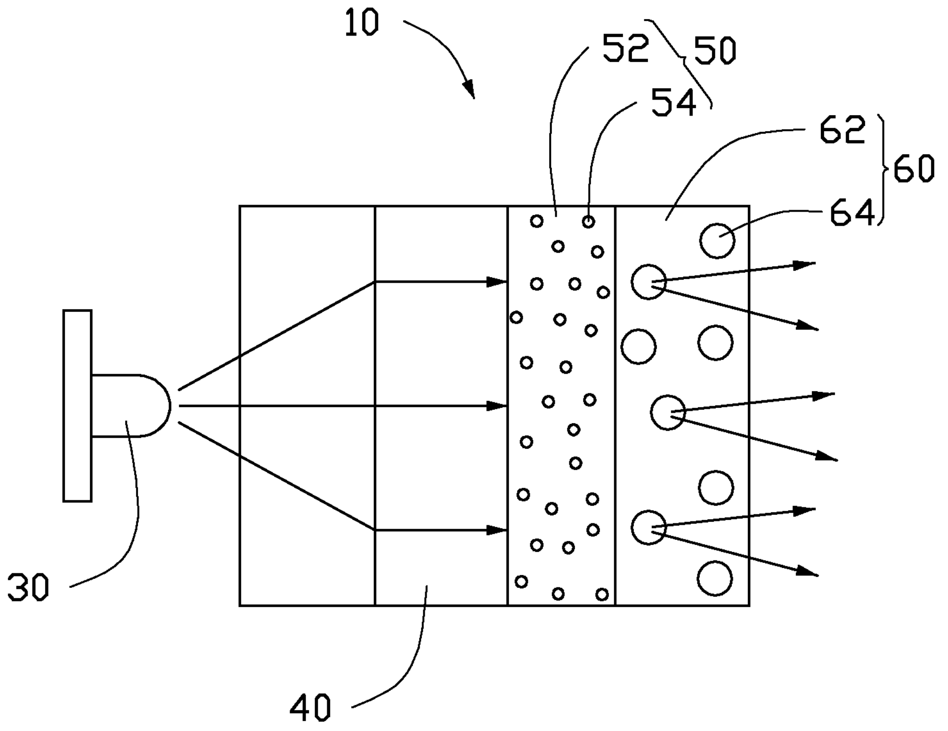
FIG. 2 is a schematic view of a laser source of the vehicle lamp system of FIG. 1.

Referring to FIG. 2, the laser source 10 includes a laser diode 30, a light splitter 40, a phosphor layer 50 and a diffusing layer 60.

The laser diode 30 is electrically connected with a storage battery in the vehicle to obtain electrical energy from the storage battery. In this embodiment, the laser diode 30 irradiates blue light when works.

The light splitter 40 is configured for splitting the light generated from the laser diode 30 into a plurality of beams. Compared with a number of laser diodes, splitting light generated from a single laser diode can greatly reduce chromatic aberration. The light splitter 40 is a passive device, and includes incoming and out coming slits, a reflecting mirror, and a chromatic dispersion component.

The phosphor layer 50 is configured for changing color of the beams transmitted from the light splitter 40. The phosphor layer 50 is formed on an outer face of the light splitter 40 by means of spraying technique or printing technique. The phosphor layer 50 includes a nonopaque base 52 and phosphor powders 54 contained in an interior of the base 52. The base 52 is made of optical grade resin or silica gel. In this embodiment, the phosphor layer 50 converts the light transmitted from the light splitter 40 into white light.

The diffusing layer 60 is configured for diffusing the beams transmitted from the light splitter 40, to thereby form a surface light source with the light evenly distributed in a large illumination area. The diffusing layer 60 includes a nonopaque base 62 and diffusing grains 64. In this embodiment, the diffusing grains 64 are contained in an interior of the base 62. The base 62 is made of optical grade resin or silica gel. The diffusing grains 64 can be made of high nonopaque organic resin. The shape of the diffusing grains 64 can be spheric, aspheric, or cubic.

Figure 3:
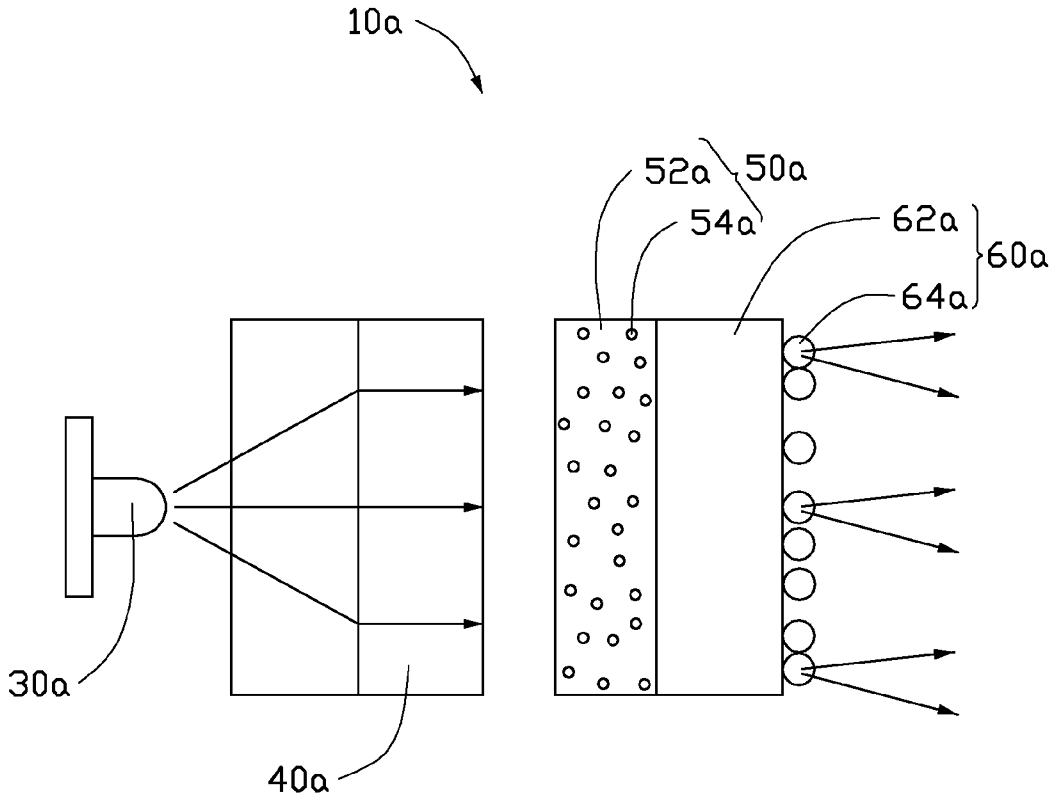
FIG. 3 is a schematic view of a laser source of a vehicle lamp system in accordance with a second embodiment of the disclosure.

Referring to FIG. 3, a laser source **10*a* of a vehicle lamp system in accordance with a second embodiment of the present disclosure is shown. The laser source 10*a* includes a laser diode 30*a*, a light splitter 40*a*, a phosphor layer 50*a* and a diffusing layer 60*a*. The phosphor layer 50*a* includes a nonopaque base 52*a* and phosphor powders 54*a* contained in an interior of the base 52*a*. The diffusing layer 60*a* includes a nonopaque base 62*a* and diffusing grains 64*a*. In the second embodiment, the phosphor layer 50*a* is spaced from the light splitter 40*a*, the diffusing grains 64*a* are formed on an outer face of the base 62*a* away from the phosphor layer 50*a*** by means of spraying technique or coating technique.

According to the disclosure, the vehicle lamp system using the laser diode as light source, the light emitted from the laser diode passes through the light splitter, the phosphor layer and the diffusing layer in sequence, thereby converting the point type light source into the surface type light source with the light evenly distributed and a large illumination area. Thus, the light utilizing efficiency of the light generated from the laser diode is greatly enhanced.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A lamp system for providing illumination for a vehicle, comprising:

a laser source comprising a laser diode, a light splitter configured to split light generated from the laser diode into a plurality of light beams, a phosphor layer adapted to changing a color of the light beams from the light splitter, and a diffusing layer adapted to diffusing the light beams transmitted from the light splitter and to forming a surface light source, and the light splitter, the phosphor layer and the diffusing layer located at the same side of the laser diode; and a reflecting plate configured to reflect light from the laser source out of the vehicle lamp system.

2. The lamp system of claim 1, wherein the reflecting plate is arc-shaped and has a reflecting face, and the reflecting face being concave and facing a light emitting direction of the laser source.

3. The lamp system of claim 1, wherein the diffusing layer comprises a nonopaque base and diffusing grains, and the diffusing grains are distributed in the base.

4. The lamp system of claim 3, wherein the base is made of optical grade resin or silica gel.

5. The lamp system of claim 3, wherein the material of the diffusing grains is nonopaque organic resin.

6. The lamp system of claim 3, wherein a shape of the diffusing grains is spherical, aspherical, or cubical.

7. The lamp system of claim 1, wherein the diffusing layer comprises a nonopaque base and diffusing grains, and the diffusing grains are formed on an outer face of the nonopaque base away from the phosphor layer by means of spraying or coating.

8. The lamp system of claim 7, wherein the base is made of optical grade resin or silica gel.

9. The lamp system of claim 7, wherein the material of the diffusing grains is nonopaque organic resin.

10. The lamp system of claim 7, wherein a shape of the diffusing grains is spherical, aspherical, or cubical.

11. The lamp system of claim 1, wherein the phosphor layer is formed on an outer face of the light splitter by means of spraying or printing.

12. The lamp system of claim 11, wherein phosphor layer comprises a nonopaque base and phosphor powders distributed in the base.

13. The lamp system of claim 12, wherein the base is made of optical grade resin or silica gel.

14. The lamp system of claim 1, wherein the phosphor layer is spaced from the light splitter.

15. The lamp system of claim 14, wherein phosphor layer comprises a nonopaque base and phosphor powders distributed in the base.

16. The lamp system of claim 15, wherein the base is made of optical grade resin or silica gel.

* * * * *